(12) United States Patent
Chen et al.

(10) Patent No.: US 9,371,978 B2
(45) Date of Patent: Jun. 21, 2016

(54) SOLAR PANEL ASSEMBLY WITH A LIGHTING PATTERN AND INCLUDING CONDUCTORS SANDWICHING A DIELECTRIC SUBSTANCE

(71) Applicants: Tsai-Hui Chen, Nantou County (TW);
Tsui-Huang Li, Taichung (TW)

(72) Inventors: Tsai-Hui Chen, Nantou County (TW);
Tsui-Huang Li, Taichung (TW)

( * ) Notice: Subject to any disclaimer, the term of this patent is extended or adjusted under 35 U.S.C. 154(b) by 0 days.

(21) Appl. No.: 14/526,727

(22) Filed: Oct. 29, 2014

(65) Prior Publication Data
US 2016/0040856 A1    Feb. 11, 2016

(51) Int. Cl.
| | |
|---|---|
| *H01L 31/042* | (2014.01) |
| *F21V 9/16* | (2006.01) |
| *F21V 3/04* | (2006.01) |
| *F21S 9/03* | (2006.01) |
| *F21W 111/02* | (2006.01) |

(52) U.S. Cl.
CPC ... *F21V 9/16* (2013.01); *F21S 9/03* (2013.01); *F21V 3/049* (2013.01); *H01L 31/042* (2013.01); *F21W 2111/02* (2013.01)

(58) Field of Classification Search
None
See application file for complete search history.

(56) References Cited

U.S. PATENT DOCUMENTS

| | | | | |
|---|---|---|---|---|
| 8,058,549 | B2* | 11/2011 | Kothari | G02B 5/285 |
| | | | | 136/244 |
| 8,404,967 | B2* | 3/2013 | Kalkanoglu | B32B 17/10788 |
| | | | | 136/251 |
| 2009/0308428 | A1* | 12/2009 | Sasakawa | H01L 31/18 |
| | | | | 136/244 |
| 2010/0219762 | A1* | 9/2010 | Brumels | F21S 8/086 |
| | | | | 315/158 |
| 2010/0282318 | A1* | 11/2010 | Kalkanoglu | B32B 17/10788 |
| | | | | 136/259 |
| 2011/0284061 | A1* | 11/2011 | Vanecek | H01L 31/022466 |
| | | | | 136/255 |
| 2011/0315937 | A1* | 12/2011 | Aoyagi | H01B 1/16 |
| | | | | 252/514 |
| 2012/0067415 | A1* | 3/2012 | Tachizono | C03C 3/21 |
| | | | | 136/256 |

FOREIGN PATENT DOCUMENTS

| | | |
|---|---|---|
| CN | 102255000 A | 11/2011 |
| CN | 202189808 U | 4/2012 |
| CN | 102738294 A | 10/2012 |
| JP | 2000034813 A | 2/2000 |
| TW | M459771 U | 8/2013 |

OTHER PUBLICATIONS

Dyeing. Dictionary.com. Dictionary.com Unabridged. Random House, Inc. http://dictionary.reference.com/browse/dyeing (accessed: Nov. 12, 2015).

* cited by examiner

*Primary Examiner* — Bilkis Jahan
(74) *Attorney, Agent, or Firm* — Alan D. Kamrath; Kamrath IP Lawfirm, P.A.

(57) ABSTRACT

A solar panel assembly with a lighting pattern includes a solar panel and an energy storage device. An electroluminescence layer is disposed on a light receiving face of the solar panel. The electroluminescence layer includes a plurality of through-holes. The number and the overall area of the plurality of through-holes are configured to permit incident light rays entering the electroluminescence layer to activate the solar panel to proceed with optical-electrical conversion, providing a light receiving effect and a light emitting effect on the same area of the solar panel. A patterned light-transmittable layer is coated on a face of the electroluminescence layer.

9 Claims, 6 Drawing Sheets

B-B'

PRIOR ART

A-A'

B-B'

B-B'

B-B'

SOLAR PANEL ASSEMBLY WITH A LIGHTING PATTERN AND INCLUDING CONDUCTORS SANDWICHING A DIELECTRIC SUBSTANCE

BACKGROUND OF THE INVENTION

The present invention relates to a solar panel assembly with a lighting pattern and, more particularly, to a solar panel assembly including a solar panel having a face coated with a light-transmittable layer with a pattern comprised of a figure and/or words to provide an aesthetic appearance while generating electricity.

Recently, solar panels have become one of the widely used mature techniques in green energy. Conventional solar panels must be installed in locations with sufficient sunshine to achieve the electricity generating effect. FIG. 1 shows a conventional solar panel 50 used in a lamp or a sign. In the daytime D, the solar panel 50 is radiated by light rays L to covert optical energy into electricity which is stored in an energy storage device 60 (such as a cell). In one of the applications in outdoor illumination, the solar panel 50 and the energy storage device 60 are coupled to a lighting device 70 of a lamp or a sign. In the nighttime N, the electricity stored in the energy storage device 60 is outputted to the lighting device 70 to provide light rays for illuminating an object or an area, such that a passersby can see specific information or pictures at night.

The lamp can be a road lamp or can be in the form of a specific geometric shape (such as an arrow) by arranging light-emitting diode lamps along a periphery of a sign. A passersby can identify the direction or the word information. Basically, the lamp is used to illuminate a certain object. Furthermore, the solar panel 50 and the energy storage device 60 are separate from the lighting device 70, because the solar panel 50 must be installed in a sunshine location, while the lighting device 70 is directed to an object.

The main reason that the solar panel 50 and the energy storage device 60 must be separate from the lighting device 70 is that the reception of light and the emission of light cannot exist on the same plane. Thus, the structure is complicated and is restricted by conventional techniques. The lighting device 70 must cooperate with words and/or figures to provide the desired information for identification. Otherwise, the lighting device 70 can only be used for illumination purposes. The appearance of the lighting device 70 is monotonous and lacks beauty and unity.

BRIEF SUMMARY OF THE INVENTION

A solar panel assembly with a lighting pattern according to the present invention includes a solar panel and an energy storage device. An electroluminescence layer is disposed on a light receiving face of the solar panel. The electroluminescence layer includes a plurality through-holes. The number and the overall area of the plurality of through-holes are configured to permit incident light rays entering the electroluminescence layer to activate the solar panel to proceed with optical-electrical conversion, providing a light receiving effect and a light emitting effect on the same area of the solar panel. A patterned light-transmittable layer is coated on a face of the electroluminescence layer.

The electroluminescence layer can include first and second electrical conductors parallel to each other and a dielectric substance sandwiched between the first and second electrical conductors. The electroluminescence layer can be cut into any complicated shape.

The dielectric substance can be fluorescent powder that emits light when energized by an alternating electric field.

The patterned light-transmittable layer can be a thin film or made of a soft, light-transmittable material. The patterned light-transmittable layer can include a pattern coated on the electroluminescence layer by dyeing, coating, or bonding.

The second electrical conductor can be disposed on the light receiving face of the solar panel. The electroluminescence layer can further include a layer of a third electrical conductor made of metal material. The layer of the third electrical conductor is disposed between the dielectric substance and the second electrical conductor. Each of the plurality of through-holes extends through the dielectric substance and the layer of the third electrical conductor. The layer of the third electrical conductor is adapted to produce reflective rays to increase luminance of output light rays of the electroluminescence layer.

In another aspect, a solar panel assembly with a lighting pattern includes a solar panel and an energy storage device. An electroluminescence layer is disposed on the light receiving face of the solar panel. The electroluminescence layer includes a plurality through-holes. The number and the overall area of the plurality of through-holes are configured to permit incident light rays entering the electroluminescence layer to activate the solar panel to proceed with optical-electrical conversion, providing a light receiving effect and a light emitting effect on the same area of the solar panel. A diffusive layer is disposed on a face of the electroluminescence layer. The diffusive layer is adapted to diffuse and uniformly distribute light rays emitted by the electroluminescence layer. A patterned light-transmittable layer is coated on a face of the diffusive layer.

The present invention will become clearer in light of the following detailed description of illustrative embodiments of this invention described in connection with the drawings.

DETAILED DESCRIPTION OF THE INVENTION

Figure 1:
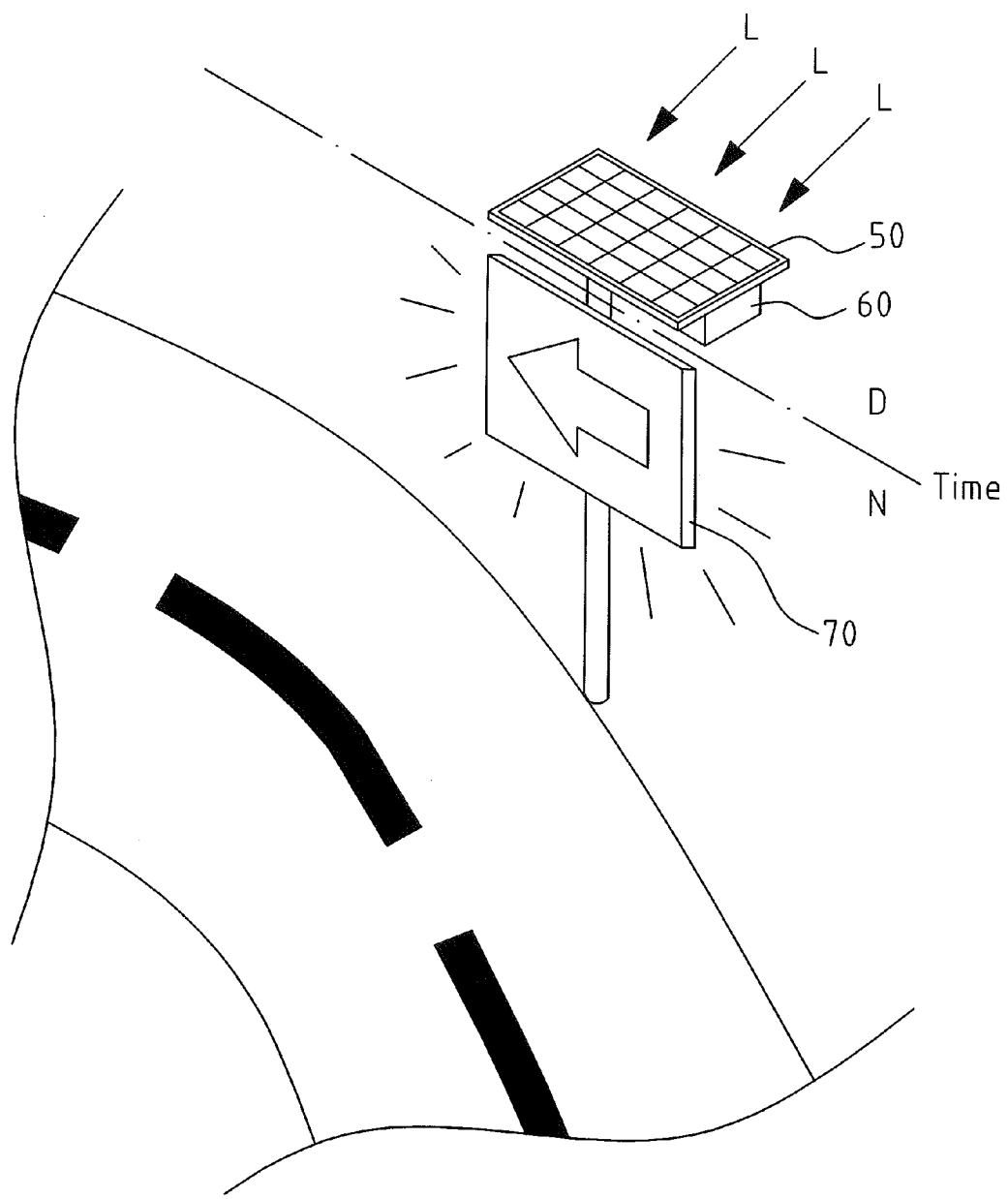
FIG. 1 is a schematic view of a conventional solar panel used with a lighting device.
Figure 2:
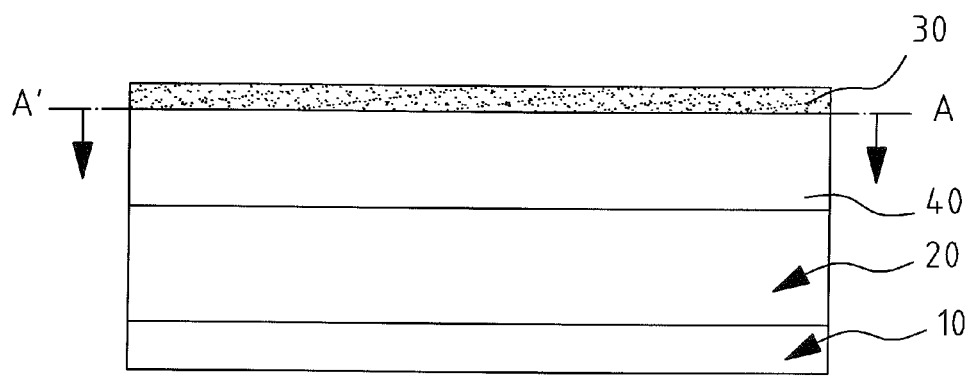
FIG. 2 is a diagrammatic side view of a solar panel assembly of an embodiment according to the present invention.
Figure 3:
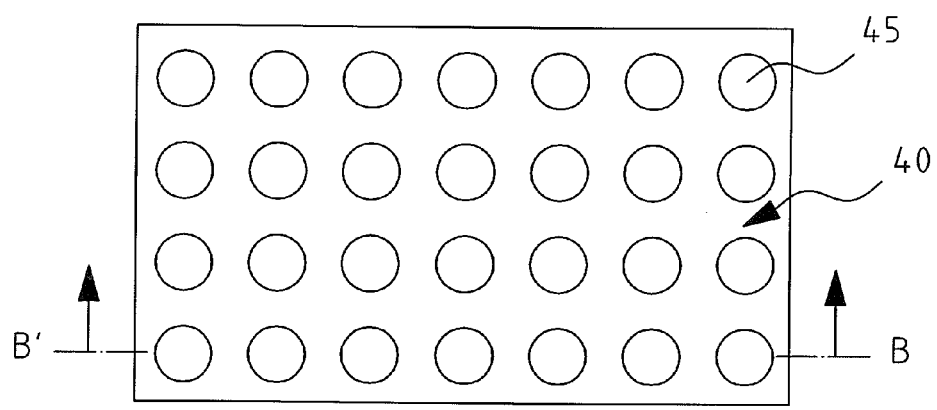
FIG. 3 is a cross sectional view taken along section line A-A' of FIG. 2.
Figure 4:
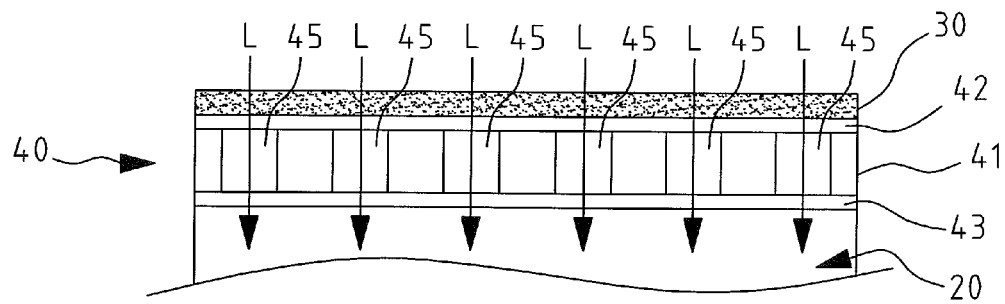
FIG. 4 is a cross sectional view taken along section line B-B' of FIG. 3.

With reference to FIGS. 2-4, a solar panel assembly with a lighting pattern of an embodiment according to the present invention receives light rays at a light receiving face to generate electricity, stores electricity, and illuminates at the light receiving face to generate a pattern, achieving an integral, aesthetic visual effect.

Specifically, the solar panel assembly with a lighting pattern of the embodiment according to the present invention includes a solar panel 20 having a light receiving face, an energy storage device 10 coupled to the solar panel 20, and an electroluminescence layer 40 disposed on the light receiving face of the solar panel 20. The solar panel 20 and the energy storage device 10 can be, but are not limited to, of a conventional design.

The electroluminescence layer 40 includes first and second electrical conductors 42 and 43 parallel to each other and a dielectric substance 41 sandwiched between the first and second electrical conductors 42 and 43. The dielectric substance 41 is fluorescent powder that is adapted to emit light when energized by an alternating electric field. The first electrical conductor 42 is mounted opposite to the light receiving face of the solar panel 20 and is transparent, such that the light rays emitted by the dielectric substance 41 (the fluorescent powder) can transmit to the outside. The second electrical conductor 43 is mounted to the light receiving face of the solar panel 20 and is transparent. The electroluminescence layer 40 can generate a light source. The electroluminescence layer 40 can be cut into any complicated shape to fit any space or any product with limited electricity. The first and second electrical conductors 42 and 43 are electrically connected to the energy storage device 10. The electroluminescence layer 40 can be controlled by a control circuit to illuminate.

Figure 6:
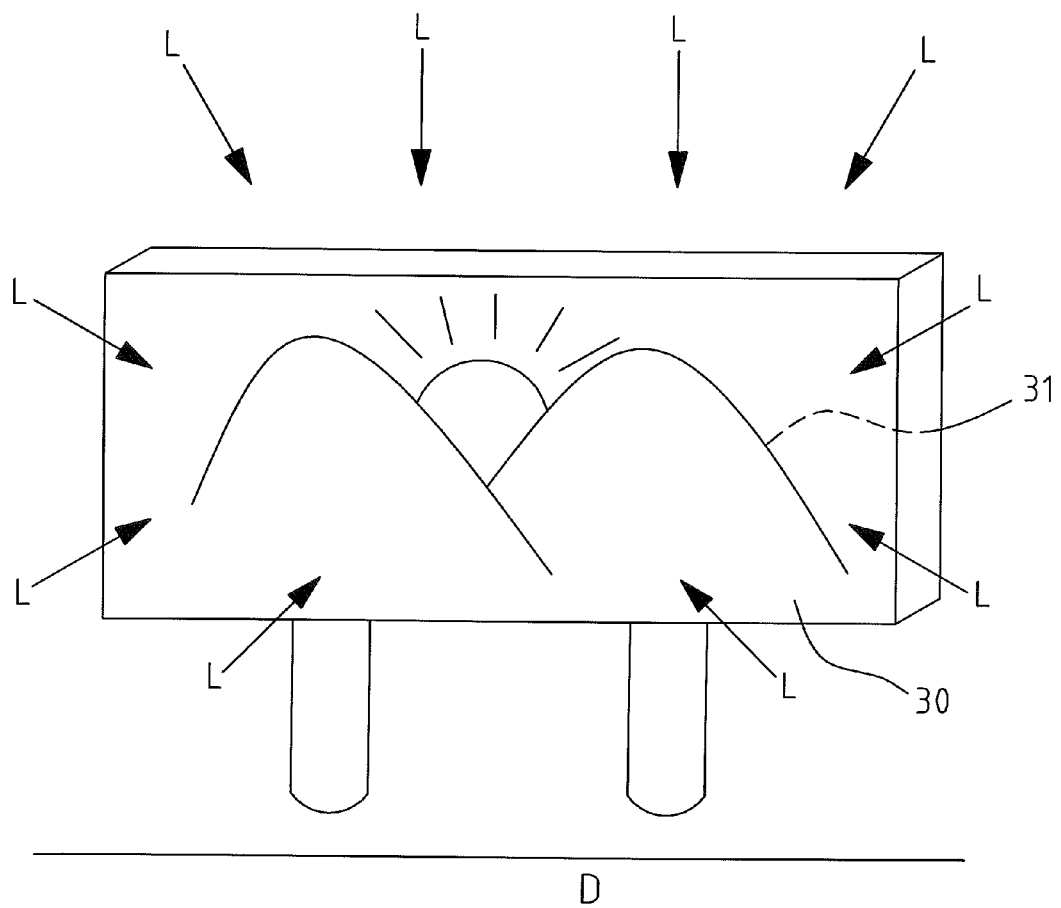
FIG. 6 is a diagrammatic view of the solar panel assembly according to the present invention, illustrating incident sunlight in the daytime.
Figure 7:
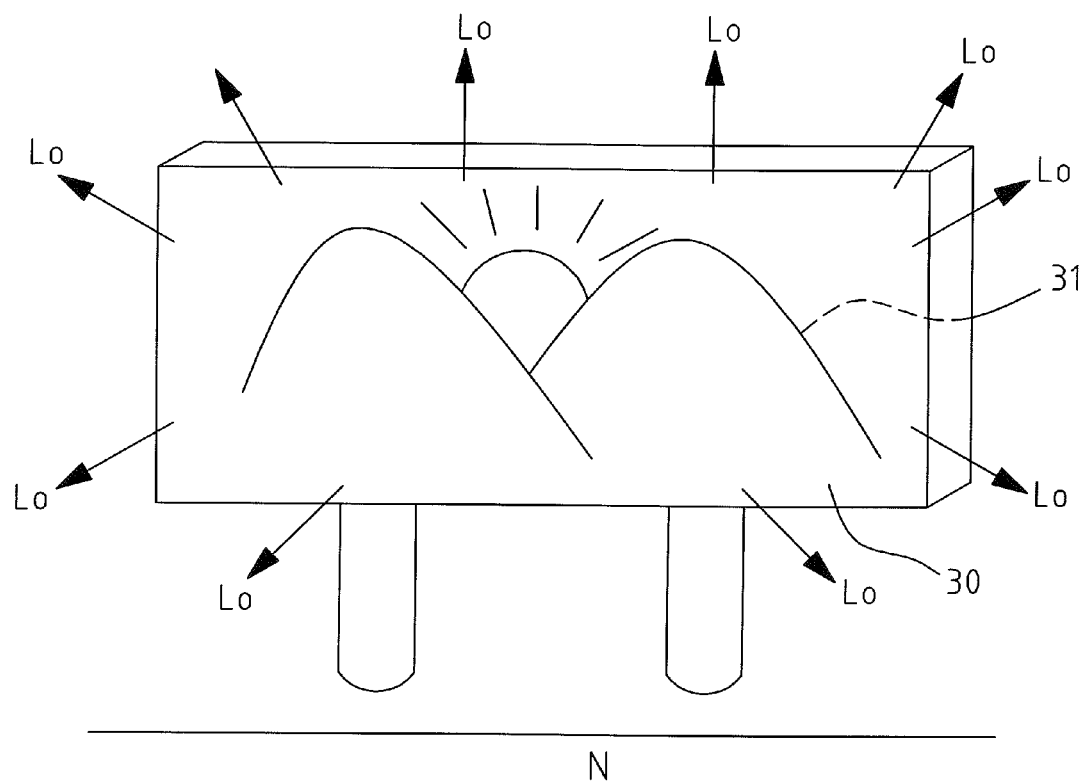
FIG. 7 is a diagrammatic view of the solar panel assembly according to the present invention, illustrating light rays outputted in the nighttime.

With reference to FIG. 6, in the daytime D, the solar panel assembly is radiated by the incident sunlight L, and the solar panel 20 and the energy storage device 10 proceed with optical-electrical conversion and starts to store electricity. With reference to FIG. 7, in the nighttime N, the control circuit detects the light and starts to electrically connect the energy storage device 10 with the electroluminescence layer 40 to illuminate light. Generally, the solar panel 20 is located between the electroluminescence layer 40 and the energy storage device 10.

To achieve the light receiving effect and the light emitting effect on the same area of the solar panel 20, the electroluminescence layer 40 includes a plurality through-holes 45. The number and the overall area of the plurality of through-holes 45 are configured to permit incident light rays entering the electroluminescence layer 40 to activate the solar panel 20 to proceed with an optical-electrical conversion. Thus, this arrangement allows the incident sunlight L to be incident to the solar panel 20 and allows the electroluminescence layer 40 to emit light, providing the light receiving effect and the light emitting effect on the same area of the solar panel 20. Since the second electrical conductor 43 mounted to the light receiving face of the solar panel 20 is transparent, each through-hole 45 can only extend through the dielectric substance 41 to permit the incident sunlight L to be incident to the solar panel 20.

Figure 5:
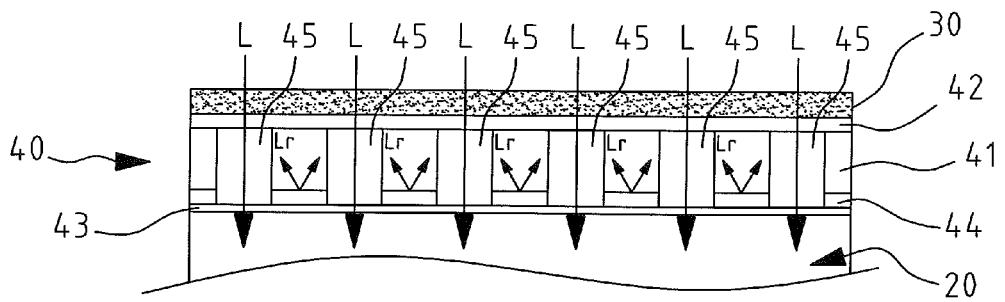
FIG. 5 is a cross sectional view similar to FIG. 4, illustrating a solar panel assembly of another embodiment according to the present invention.

In another embodiment shown in FIG. 5, the electroluminescence layer 40 further includes a layer of a third electrical conductor 44 made of metal material. The layer of the third electrical conductor 44 is disposed between the dielectric substance 41 and the second electrical conductor 43. Each through-hole 45 extends through the dielectric substance 41 and the layer of the third electrical conductor 44. The layer of the third electrical conductor 44 is adapted to produce reflective rays Lr to increase luminance of light rays Lo emitted by the electroluminescence layer 40 in addition to providing a conducting effect.

Another important feature of the present invention is that a patterned light-transmittable layer 30 is coated on a face of the electroluminescence layer 40. The patterned light-transmittable layer 30 can be a thin film or made of a soft, light-transmittable material and can include a pattern 31 formed by dyeing, coating, or bonding. The patterned light-transmittable layer 30 has a transmittance.

By such an arrangement, in the daytime D, the incident sunlight L can still pass the through-holes 45 of the electroluminescence layer 40 to the solar panel 20. In the nighttime N, the light rays emitted by of the electroluminescence layer 40 can evenly transmit to the outside and can present the figure, color, or word information on an outer face of the patterned light-transmittable layer 30. Since the pattern 31 is formed on the outer face of the patterned light-transmittable layer 30 by dyeing, coating, or bonding, the pigment of the color of the pattern must be transmittable to light. By selecting the transmittance of the pigment of the color and by cooperating with the setting of a different thickness of the colored layer, a delicate pattern 31 with a certain electricity generating power desired by the designer can be obtained. The electroluminescence layer 40 is mainly used to illuminate and can be cut into any desired shape. Thus, the electroluminescence layer 40 should not be limited to any special specification.

Figure 8:
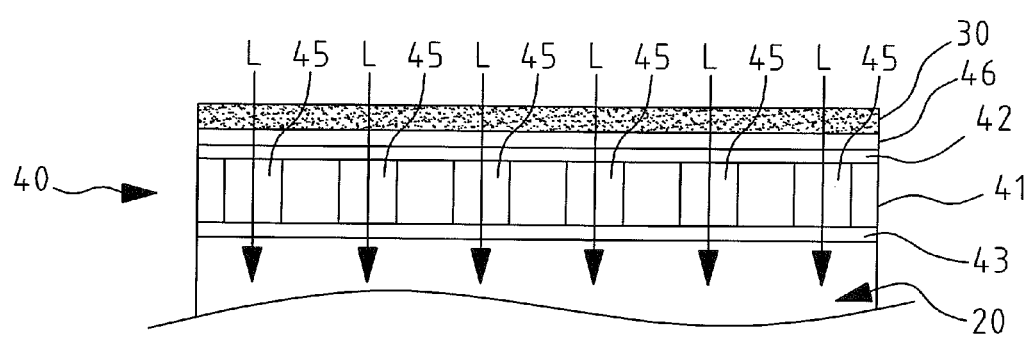
FIG. 8 is a cross sectional view similar to FIG. 4, illustrating a solar panel assembly of a further embodiment according to the present invention.

In a further embodiment shown in FIG. 8, in order to more uniformly diffuse the output light rays Lo of the electroluminescence layer 40, a diffusive layer 46 is disposed on a face of the electroluminescence layer 40, such as between the first electrical conductor 42 and the patterned light-transmittable layer 30. The diffusive layer 46 can be in the form of a light guiding board or a diffusing board. The diffusive layer 46 is adapted to diffuse and uniformly distribute light rays. By the provision of the diffusive layer 46, the light rays Lo emitted by the electroluminescence layer 40 can be uniformly distributed on the electroluminescence layer 40. Furthermore, the patterned light-transmittable layer 30 is coated on the face of the diffusive layer 46 to make the light rays Lo more uniform, providing an aesthetic appearance.

The solar panel assembly with a lighting pattern according to the present invention includes the following advantages:

1. The appearance of the solar panel assembly with a lighting pattern according to the present invention can include any desired pattern 31 designed according to the demand of the designer while having a controlled amount of electricity generated by the solar panel 20. The pattern 31 is neither comprised of a plurality of color blocks of a dot matrix nor radiated by a lamp. Thus, an excellent visual effect is provided no matter whether viewed closely or distantly. In comparison with conventional designs, the visual effect provided by the solar panel assembly according to the present invention is a great improvement. Such a technical breakthrough in the appearance provides users with a motive to install the solar panel assembly on the outer surface of a building, eliminating the restrictions in the current use.

2. The solar panel assembly with a lighting pattern according to the present invention can achieve the light receiving effect and the light emitting effect on the same area of the solar panel 20, which is aesthetic and has many applications while achieving the goal of green energy.

Although specific embodiments have been illustrated and described, numerous modifications and variations are still possible without departing from the scope of the invention. The scope of the invention is limited by the accompanying claims.

The invention claimed is:

1. A solar panel assembly with a lighting pattern, comprising:
    a solar panel including a light receiving face;
    an energy storage device;
    an electroluminescence layer disposed on the light receiving face of the solar panel, with the electroluminescence layer including a plurality of through-holes, wherein a number and an overall area of the plurality of through-holes permit incident light rays entering the electroluminescence layer to activate the solar panel to proceed with an optical-electrical conversion, providing a light receiving effect and a light emitting effect on a same area of the solar panel; and a patterned light-transmittable layer disposed over a face of the electroluminescence layer, with the patterned light-transmitted layer including a pattern in the form of a figure, color, or word information, wherein the electroluminescence layer includes first and second electrical conductors parallel to each other and a dielectric substance sandwiched between the first and second electrical conductors, with the second electrical conductor disposed on the light receiving face of the solar panel, with the electroluminescence layer further including a layer of a third electrical conductor made of metal material, with the layer of the third electrical conductor disposed between the dielectric substance and the second electrical conductor, with each of the plurality of through-holes extending through the dielectric substance and the layer of the third electrical conductor, and with the layer of the third electrical conductor producing reflective rays to increase luminance of output light rays of the electroluminescence layer.

2. The solar panel assembly with a lighting pattern as claimed in claim 1, wherein the electroluminescence layer is cut into a complicated shape.

3. The solar panel assembly with a lighting pattern as claimed in claim 2, wherein the dielectric substance is fluorescent powder, and wherein the fluorescent powder emits light when energized by an alternating electric field.

4. The solar panel assembly with a lighting pattern as claimed in claim 1, wherein the patterned light-transmittable layer is a thin film or made of a soft, light-transmittable material, and wherein the pattern is coated on the electroluminescence layer by dyeing, coating, or bonding.

5. A solar panel assembly with a lighting pattern, comprising:

a solar panel including a light receiving face;

an energy storage device;

an electroluminescence layer disposed on the light receiving face of the solar panel, with the electroluminescence layer including a plurality of through-holes, wherein a number and an overall area of the plurality of through-holes permit incident light rays entering the electroluminescence layer to activate the solar panel to proceed with an optical-electrical conversion, providing a light receiving effect and a light emitting effect on a same area of the solar panel;

a diffusive layer disposed on a face of the electroluminescence layer, with the diffusive layer diffusing and uniformly distributing light rays emitted by the electroluminescence layer; and a patterned light-transmittable layer coated on a face of the diffusive layer, with the patterned light-transmitted layer including a pattern in the form of a figure, color, or word information.

6. The solar panel assembly with a lighting pattern as claimed in claim 5, wherein the patterned light-transmittable layer is in a form of a thin film or is made of a soft, light-transmittable material, and wherein the pattern is coated on the diffusive layer by dyeing, coating, or bonding.

7. The solar panel assembly with a lighting pattern as claimed in claim 5, wherein the electroluminescence layer includes first and second electrical conductors parallel to each other and a dielectric substance sandwiched between the first and second electrical conductors, and wherein the electroluminescence layer is cut into a complicated shape.

8. The solar panel assembly with a lighting pattern as claimed in claim 7, wherein the dielectric substance is fluorescent powder, and wherein the fluorescent powder emits light when energized by an alternating electric field.

9. The solar panel assembly with a lighting pattern as claimed in claim 7, with the second electrical conductor disposed on the light receiving face of the solar panel, with the electroluminescence layer further including a layer of a third electrical conductor made of metal material, with the layer of the third electrical conductor disposed between the dielectric substance and the second electrical conductor, with each of the plurality of through-holes extending through the dielectric substance and the layer of third electrical conductor, and with the layer of the third electrical conductor producing reflective rays to increase luminance of output light rays of the electroluminescence layer.

* * * * *